United States Patent [19]

Jodoin

[11] Patent Number: 4,577,258

[45] Date of Patent: * Mar. 18, 1986

[54] DECOUPLED INTEGRATED CIRCUIT PACKAGE

[75] Inventor: Raymond C. Jodoin, Scottsdale, Ariz.

[73] Assignee: Rogers Corporation, Rogers, Conn.

[*] Notice: The portion of the term of this patent subsequent to Feb. 26, 2002 has been disclaimed.

[21] Appl. No.: 676,490

[22] Filed: Nov. 29, 1984

Related U.S. Application Data

[62] Division of Ser. No. 403,408, Jul. 30, 1982, Pat. No. 4,502,101.

[51] Int. Cl.⁴ ............................................... H05K 7/20
[52] U.S. Cl. ..................................... 361/321; 361/386
[58] Field of Search .............. 361/306, 400, 321, 386; 523/427

[56] References Cited

U.S. PATENT DOCUMENTS

| | | | |
|---|---|---|---|
| 3,277,354 | 10/1966 | Ikeda et al. | 361/321 |
| 3,348,568 | 10/1967 | Stark et al. | 361/321 |
| 3,646,246 | 2/1972 | Olney | 351/400 |
| 3,753,046 | 8/1973 | Towell | 361/400 |
| 3,880,493 | 4/1975 | Lockhurt | 339/147 R |
| 4,209,754 | 6/1980 | Shiki et al. | 361/321 |
| 4,356,532 | 10/1982 | Donaher et al. | 361/393 |
| 4,394,713 | 7/1983 | Yoshida | 361/433 |
| 4,502,101 | 2/1985 | Jodoin | 361/321 X |

FOREIGN PATENT DOCUMENTS

| | | |
|---|---|---|
| 112845 | 2/1979 | Japan . |
| 113040 | 2/1983 | Japan . |

*Primary Examiner*—Donald A. Griffin

[57] ABSTRACT

High frequency noise is decoupled from a bus conductor which supplies power to an integrated circuit by insertion of a metallized ceramic chip in the space defined by the two parallel rows of leads extending from the circuit. The ceramic chip is provided with a pair of rectangular leads, connected to respective of the metalized opposite surfaces thereof, which are respectively connected to the power supply leads of the circuit.

4 Claims, 2 Drawing Figures

DECOUPLED INTEGRATED CIRCUIT PACKAGE

This application is a divisional application of application Ser. No. 403,408 filed July 30, 1982 and now U.S. Pat. No. 4,502,101 issued Feb. 26, 1985.

BACKGROUND OF THE INVENTION (1) Field of the Invention

The present invention relates to microelectronics and particularly to improving the high frequency performance of integrated circuits which, in part, have very fast switching times. More specifically, this invention is directed to methods of and apparatus for decoupling switching transients and other high frequency noise from the power supplies for integrated circuits. Accordingly, the general objects of the present invention are to provide novel and improved methods and articles of such character.

(2) Description of the Prior Art

It is well known in the field of microelectronics that high frequency operation, particularly the switching of integrated circuits, can result in switching transients being coupled into the power supply circuit. There have, in the past, been several techniques proposed for preventing the coupling of undesired high frequency interference into the power supply circuit for an integrated circuit wherein the noise is generated. Thus, for example, it is known to employ low pass filters which are connected between the common power supply leads of an integrated circuit. Such low pass filters include decoupling capacitors which are mounted on a printed circuit board and connected by traces on the board to the plated through-holes which receive the ground and power supply connection leads of the integrated circuit. This technique has several deficiencies. The most serious of these deficiencies resides in the fact that the circuits including the capacitors become highly inductive at high frequencies as a consequence of the shape and length of the leads and interconnection traces between the discrete capacitor and the integrated circuit which it decouples. The inductance of the leads and printed circuit board traces may be sufficiently high to nullify the effect of the capacitor in the circuit. A second serious deficiency resides in the inherent volumetric inefficiency incident to employing a low pass filter which requires a discrete capacitor. The space requirements of the capacitor and the interconnection traces on the printed circuit board adversely affect the component packaging density which can be achieved.

In an effort to overcome the above-discussed deficiencies associated with the use of low-pass filters with discrete decoupling capacitors mounted on a printed circuit board, it has been proposed to provide sockets which receive the integrated circuit and which have a decoupling capacitor formed integrally therewith. An example of this approach may be seen from U.S. Pat. No. 3,880,493. While an improvement over the previous technique of employing low-pass filters, the technique of U.S. Pat. No. 3,880,493 also has certain inherent deficiencies. Firstly, the socket with integral capacitor is a comparatively complex and thus expensive component. Secondly, the patented technique is also characterized by volumetric inefficiency since, in effect, it comprises a socket mounted above a socket which is mounted above a printed circuit board; the uppermost socket being that in which the integrated circuit is packaged.

SUMMARY OF THE INVENTION

The present invention overcomes the above-briefly described and other deficiencies and disadvantages of the prior art by providing a unique technique for decoupling high frequency noise from a bus conductor which supplies power to an integrated circuit. The present invention also encompasses a unique decoupling capacitor for use in the practice of this novel method.

A decoupling capacitor in accordance with the present invention comprises a very thin rectangular chip of ceramic material which is metalized on the opposite sides. Leads are provided, respectively from the metalized coatings on the opposite sides of the ceramic chip, at two points which are adjacent a pair of diagonally opposed corners of the rectangularly shaped ceramic chip. These leads, which are themselves of rectangular cross section, extend outwardly a short distance generally in the plane of the metalized surface to which they are attached and are then bent downwardly so as to both extend in a direction which is transverse to the planes of the metalized surfaces. The entire assembly, with the exception of the two transversely extending lead portions, may then be encapsulated within a film of suitable non-conductive material.

In practice of the method of the present invention the above-described ceramic capacitor, which will be dimensioned so as to be received in the space between the two rows of leads extending from a conventional dual-in-line integrated circuit, will be plugged into a printed circuit board, the leads from the capacitor being inserted in the board through-holes at which the ground and power supply conductors respectively terminate. The capacitor is inserted such that it remains spaced above the printed circuit board and is generally parallel therewith. The integrated circuit is then positioned over the capacitor and inserted in the board such that the power supply leads of the integrated circuit will be received in the same printed circuit board through-holes in which the capacitor leads have been inserted. The integrated circuit will typically be installed such that it is in abutting contact with the capacitor whereby the ceramic chip of the capacitor may function as a heat sink for the integrated circuit. Assembly is completed by soldering, in the conventional manner, the leads from the integrated circuit and capacitor to the printed circuit board with the spacing between the capacitor and board permitting cleaning and thus insuring that there will be no soldering flux trapped under the capacitor.

BRIEF DESCRIPTION OF THE DRAWING

The present invention may be better understood and its numerous objects and advantages will become apparent to those skilled in the art by reference to the accompanying drawing wherein like reference numerals refer to like elements in the several figures and in which.

DESCRIPTION OF THE PREFERRED EMBODIMENT

Figure 1:
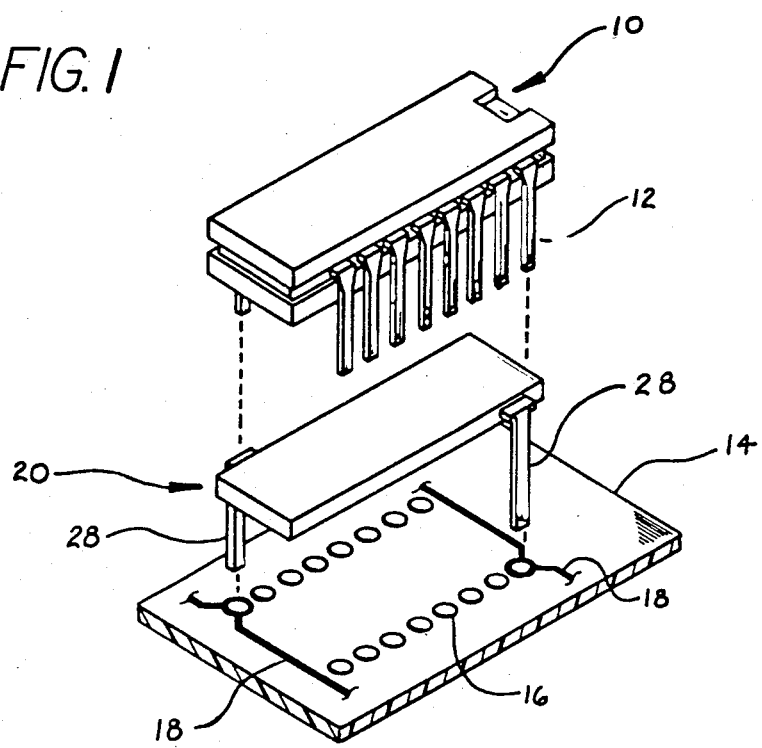
FIG. 1 is an exploded view which depicts practice of the present invention.

With reference now to the drawing, an integrated circuit is indicated generally at 10. Integrated circuit 10 is of the dual-in-line type. A plurality of connecting pins 12 extend downwardly from integrated circuit 10 as shown. A pair of diagonally opposite pins 12 respectively comprise the ground and power supply connections to circuit 10. Integrated circuit 10 is to be mounted on a printed circuit board which has been indicated schematically at 14. The circuit board will include a plurality of plated through-holes 16 which receive the pins 12 of circuit 10. Two of the through-holes 16 of board 14, which are positioned to receive the diagonally opposite ground and power supply connecting pins of circuit 10, will be electrically connected, by means of traces or conductors 18 formed on board 14, to the conductors of a power supply bus. There will, of course, be conductors 18 on board 16 for interconnecting all of the plated-through holes 16 with other circuit components and/or establishing interconnections between various of the pins 12 of circuit 10.

Figure 2:
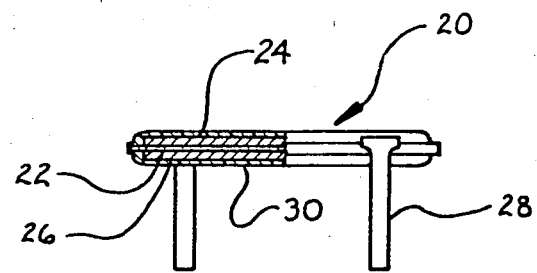
FIG. 2 is an enlarged side elevation view, partly in section, of the decoupling capacitor of FIG. 1.

As may be seen from FIG. 1, a decoupling capacitor, which has been indicated generally at 20, is positioned between integrated circuit 10 and printed circuit board 14. Decoupling capacitor 20 comprises a rectangularly shaped chip of ceramic material such as, for example, barium titanate (BaTiO$_3$) or strontium titanate (SrTiO$_3$). The opposite sides of chip 22 are metalized to define the plates 24 and 26 of a single layer capacitor. The metalizing may, for example, be silver or silver palladium ink, electrodeposited nickel or tin, copper, aluminum or zinc. Leads 28 are connected to the capacitor plates, i.e., respective of the metalized layers 24 and 26. The leads 28 extend outwardly a short distance in a direction which is generally parallel to the capacitor plates to which they are connected and then are bent, at 90°, to extend downwardly in a direction generally transverse to the planes of the metalized layers 24 and 26. It is important to note that the leads 28 are, like the power supply pins of integrated circuit 10, diagonally displaced with respect to the rectangular ceramic chip 22, i.e., the leads 28 extend from areas adjacent a pair of diagonally opposite corners of the decoupling capacitor 20. It is important to note that the leads 28 are, in cross section, of rectangular shape to minimize inductance. It is further to be noted that the leads 28 are positioned and configured such that they may be inserted in the same plated through-holes in board 14 which receives the ground and power supply pins of integrated circuit 10. The decoupling capacitor 20 is typically completed by encapsulation of the chip 22 and its metalized surfaces 24 and 26 by a thin layer of an insulating film such as, for example, MYLAR, TEDLAR or NOMEX. The encapsulation is indicated in FIG. 2 at 30.

In use, the capacitor 20 will be inserted in the printed circuit board 14 to a point where the lower side thereof is closely spaced from the surface of board 14. This spacing is necessary to permit cleaning between printed circuit board 14 and capacitor 20 thereby insuring that there will be no soldering flux trapped under the capacitor. After the capacitor has been inserted in board 14, the integrated circuit 10 is positioned over the capacitor and all of its pins 12 inserted in through-hole 16 in board 14. In inserting integrated circuit 10 the ground and power supply pins will fit into the same through-holes 16 in board 14 which has received the leads 28 from capacitor 20. The integrated circuit 10 will preferably be inserted to the point where the underside thereof is in abutting contact with the upper side of the decoupling capacitor 20. Accordingly, the capacitor 20, particularly the ceramic chip 22, will act as a heat sink for integrated circuit 10 thus performing the dual functions of decoupling and helping to prevent over-heating of the integrated circuit.

It is to be understood that the present invention has been described by way of illustration and not limitation.

What is claimed is:

1. A decoupling capacitor for use with an integrated circuit element which has a plurality of contact pins extending therefrom in a pair of spaced parallel rows, with a first pin in one row and a second spaced pin in the other row being power supply pins, the capacitor including:

a flat rectangular ceramic body having a pair of opposed surfaces;

a metalized coating on each of said opposed surfaces of said ceramic body;

a first conductor in electrical contact with one of said metalized coatings, and a second conductor in electrical contact with the other of said metalized coatings, said first and second conductors extending outwardly and downwardly from points located adjacent opposite sides of said body and being coordinated with the first and second spaced pins of said integrated circuit element for insertion in a pair of power supply sockets in a circuit board; and an insulating means encapsulating said ceramic body and metalized coatings, said conductors extending through said insulating means.

2. The capacitor of claim 1 wherein:

said first and second conductors are of rectangular shape.

3. The capacitor of claim 1 wherein:

said first and second conductors extend outwardly and downwardly from a pair of diagonally opposite corners of said rectangular ceramic body.

4. The capacitor of claim 3 wherein:

said first and second conductors are of rectangular shape.

* * * * *